(12) United States Patent
Li

(10) Patent No.: US 11,271,188 B2
(45) Date of Patent: Mar. 8, 2022

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Wenjie Li, Guangdong (CN)

(73) Assignee: SHENZHEN CHINA STAR OPTOELECTRONICS SEMICONDUCTOR DISPLAY TECHNOLOGY CO., LTD, Guangdong (CN)

( * ) Notice: Subject to any disclaimer, the term of this patent is extended or adjusted under 35 U.S.C. 154(b) by 245 days.

(21) Appl. No.: 16/614,388

(22) PCT Filed: Sep. 5, 2019

(86) PCT No.: PCT/CN2019/104555
§ 371 (c)(1),
(2) Date: Nov. 18, 2019

(87) PCT Pub. No.: WO2020/224139
PCT Pub. Date: Nov. 12, 2020

(65) Prior Publication Data
US 2021/0336223 A1    Oct. 28, 2021

(30) Foreign Application Priority Data

May 7, 2019    (CN) .......................... 201910374865.7

(51) Int. Cl.
*H01L 51/52*    (2006.01)
*H01L 27/32*    (2006.01)
*H01L 51/56*    (2006.01)

(52) U.S. Cl.
CPC ...... *H01L 51/5271* (2013.01); *H01L 27/3258* (2013.01); *H01L 51/5265* (2013.01); *H01L 51/56* (2013.01); *H01L 2227/323* (2013.01)

(58) Field of Classification Search
CPC .... H01L 51/5265; H01L 51/5271; B32B 3/30
See application file for complete search history.

(56) References Cited

U.S. PATENT DOCUMENTS 5,880,797 A  *  3/1999  Yamada ............ G02F 1/133377
                                                     349/84
7,449,724 B2 * 11/2008 Yamazaki ........... H01S 5/18388
                                                     257/98
(Continued)

FOREIGN PATENT DOCUMENTS

CN    104103673 A    10/2014
CN    104362257 A     2/2015
(Continued)

OTHER PUBLICATIONS

Machine translation, Nishioka, Japanese Pat. Pub. No. JP 2011-228229A, translation date: Sep. 16, 2021, Espacenet, all pages. (Year: 2021).*

(Continued)

*Primary Examiner* — Victoria K. Hall
(74) *Attorney, Agent, or Firm* — Soroker Agmon Nordman

(57) ABSTRACT

The present disclosure provides a display panel and manufacturing method thereof, the display panel including a substrate, a first organic layer disposed on the substrate, a reflective layer disposed on the first organic layer, a light transmissive layer disposed on the reflective layer, and the reflective layer includes a first surface adjacent to the first (Continued)

organic layer and a second surface adjacent to the light transmissive layer, the second surface being a concave surface.

13 Claims, 6 Drawing Sheets

(56) References Cited

U.S. PATENT DOCUMENTS

| | | | |
|---|---|---|---|
| 7,502,392 B2* | 3/2009 | Nomura | H01S 5/04256 372/9 |
| 8,368,617 B2* | 2/2013 | Asaki | H01L 51/5203 345/76 |
| 8,921,839 B2* | 12/2014 | Zhang | H01L 51/5271 257/40 |
| 9,209,231 B2* | 12/2015 | Song | H01L 51/5225 |
| 9,246,133 B2* | 1/2016 | Yamazaki | H01L 51/5271 |
| 9,263,506 B2* | 2/2016 | Kim | H01L 27/3258 |
| 9,269,925 B2* | 2/2016 | Song | H01L 51/56 |
| 9,287,526 B2* | 3/2016 | Miyazawa | H01L 51/5271 |
| 9,401,390 B2* | 7/2016 | Song | H01L 51/56 |
| 9,490,301 B2* | 11/2016 | Yi | H01L 27/322 |
| 10,090,489 B2* | 10/2018 | Uchida | H01L 51/5209 |
| 10,143,062 B2* | 11/2018 | Uchida | H01L 51/50 |
| 10,157,967 B2* | 12/2018 | Uchida | H01L 51/5234 |
| 10,164,202 B2* | 12/2018 | Inoue | H01L 27/3248 |
| 10,199,605 B2* | 2/2019 | Inoue | H01L 51/5234 |
| 10,219,349 B2* | 2/2019 | Matsunaga | H05B 33/28 |
| 10,224,512 B2* | 3/2019 | Inoue | H05B 33/24 |
| 10,381,600 B2* | 8/2019 | Uchida | H01L 51/5271 |
| 10,403,695 B2* | 9/2019 | Bang | H01L 51/5212 |
| 10,411,223 B2* | 9/2019 | Inoue | H01L 29/41733 |
| 10,418,592 B2* | 9/2019 | Inoue | H01L 27/3246 |
| 10,431,634 B2* | 10/2019 | Uchida | G02B 5/20 |
| 10,516,131 B2* | 12/2019 | Koike | H01L 51/5072 |
| 10,707,285 B2* | 7/2020 | Kwon | H01L 27/3218 |
| 10,826,021 B2* | 11/2020 | Uchida | H01L 27/3276 |
| 10,937,987 B1* | 3/2021 | Guillou | H01L 51/5265 |
| 10,957,879 B2* | 3/2021 | Hu | H01L 51/56 |
| 11,031,450 B2* | 6/2021 | Kim | H01L 27/3246 |
| 2006/0028132 A1* | 2/2006 | Tsai | H01L 27/3246 313/509 |
| 2006/0152151 A1* | 7/2006 | Seo | H01L 27/322 313/506 |
| 2007/0290607 A1* | 12/2007 | Okada | H01L 51/5268 313/504 |
| 2008/0024402 A1* | 1/2008 | Nishikawa | H05B 33/22 345/82 |
| 2008/0211385 A1* | 9/2008 | Kim | H01L 51/0096 313/498 |
| 2009/0294785 A1* | 12/2009 | Cok | H01L 51/5262 257/98 |
| 2010/0181554 A1* | 7/2010 | Yoshida | H01L 51/5262 257/40 |
| 2011/0297943 A1* | 12/2011 | Kim | H01L 27/3258 257/59 |
| 2013/0001609 A1* | 1/2013 | Ichinose | H01L 51/5275 257/89 |
| 2014/0159009 A1* | 6/2014 | Song | H01L 51/56 257/40 |
| 2014/0159020 A1* | 6/2014 | Song | H01L 51/5265 257/40 |
| 2014/0159021 A1* | 6/2014 | Song | H01L 51/5265 257/40 |
| 2014/0264291 A1* | 9/2014 | Zhang | H01L 51/5271 257/40 |
| 2014/0312312 A1* | 10/2014 | Takii | H01L 27/3262 257/40 |
| 2014/0312319 A1* | 10/2014 | Kim | H01L 27/3258 257/40 |
| 2015/0138463 A1* | 5/2015 | Jinta | H01L 27/3246 349/33 |
| 2015/0187989 A1* | 7/2015 | Sato | H01L 27/322 257/98 |
| 2016/0260789 A1 | 9/2016 | Zhang | |
| 2017/0256748 A1* | 9/2017 | Koike | H01L 51/5036 |
| 2017/0263896 A1* | 9/2017 | Inoue | H01L 27/3246 |
| 2017/0280530 A1* | 9/2017 | Matsunaga | H01L 51/5271 |
| 2017/0294493 A1* | 10/2017 | Yoo | H01L 27/3218 |
| 2017/0317148 A1* | 11/2017 | Uchida | G09F 9/30 |
| 2017/0325314 A1* | 11/2017 | Uchida | H05B 33/24 |
| 2018/0097195 A1* | 4/2018 | Inoue | H01L 51/5012 |
| 2018/0122875 A1* | 5/2018 | Bang | H01L 51/5203 |
| 2018/0166648 A1 | 6/2018 | Dai et al. | |
| 2018/0212198 A1* | 7/2018 | Inoue | H05B 33/24 |
| 2018/0226615 A1* | 8/2018 | Uchida | H01L 51/5209 |
| 2018/0269428 A1* | 9/2018 | Uchida | H01L 51/5088 |
| 2018/0287099 A1* | 10/2018 | Uchida | G02B 5/20 |
| 2018/0323404 A1* | 11/2018 | Inoue | G09F 9/30 |
| 2018/0358577 A1* | 12/2018 | Inoue | H01L 51/5234 |
| 2019/0067379 A1* | 2/2019 | Uchida | H01L 27/322 |
| 2019/0074464 A1* | 3/2019 | Koike | H05B 33/06 |
| 2019/0165321 A1* | 5/2019 | Choi | H01L 27/3258 |
| 2019/0189701 A1* | 6/2019 | Bang | H01L 51/5271 |
| 2019/0189713 A1* | 6/2019 | Kondo | H01L 51/5056 |
| 2019/0198593 A1* | 6/2019 | Jo | H01L 51/5215 |
| 2020/0075699 A1* | 3/2020 | Kim | H01L 51/5225 |
| 2020/0136092 A1* | 4/2020 | Kim | H01L 51/5281 |
| 2021/0336226 A1* | 10/2021 | Liu | H01L 51/5253 |

FOREIGN PATENT DOCUMENTS

| | | | | |
|---|---|---|---|---|
| CN | 105742521 A | * | 7/2016 | H01L 51/50 |
| CN | 105742521 A | | 7/2016 | |
| CN | 106717121 A | | 5/2017 | |
| CN | 208256730 U | * | 12/2018 | H01L 51/52 |
| CN | 208256730 U | | 12/2018 | |
| JP | 2003229283 A | * | 8/2003 | H05B 33/24 |
| JP | 2011228229 A | * | 11/2011 | H05B 33/24 |
| WO | WO-2004055920 A2 | * | 7/2004 | H01L 51/20 |

OTHER PUBLICATIONS

Machine translation, Kobayashi, Japanese Pat. Pub. No. JP 2003-229283A, translation date: Sep. 16, 2021, Espacenet, all pages. (Year: 2021).*
Machine translation, Wang, Chinese Pat. Pub. No. CN 105742521A translation date: Sep. 16, 2021, Espacenet, all pages. (Year: 2021).*
Machine translation, Zhou, Chinese Pat. Pub. No. CN208256730U translation date: Sep. 16, 2021, Espacenet, all pages. (Year: 2021).*
International Search Report, International Searching Authority/ China National Intellectual Property Administration, International Application No. PCT/CN2019/104555, dated Dec. 24, 2019, all pages. (Year: 2019).*
First Office Action, The State Intellectual Property Office of People's Republic of China, Chinese App. No. 201910374865.7, dated Dec. 11, 2019, all pages. (Year: 2019).*

* cited by examiner

DISPLAY PANEL AND MANUFACTURING METHOD THEREOF

FIELD OF INVENTION

The present disclosure relates to the field of display technologies, and more particularly to a display panel and manufacturing method thereof.

BACKGROUND OF INVENTION

In flat panel display technology, organic light emitting diode (OLED) displays have many advantages such as being light and thin, active illumination, fast response times, wide viewing angles, wide color gamut, high brightness and low power consumption. Therefore, it has gradually become third generation display technology after the liquid crystal displays.

In preparing current OLED devices, a light emitting layer is usually disposed between a total reflection and a semi-reflective structure to form a microcavity effect, so that photons are reflected back and forth multiple times in the microcavity. By the design of the cavity length, the intensity of the final emitted light can be increased. However, when the photons are coupled out from one side, there is a difference in viewing angle. When the structure of the device is fixed, as the viewing angle increases, the optical path difference of the light changes, and the light is shifted to the short wavelength band, resulting in a deviation of the viewing angle, and make the user experience worse.

Therefore, there is a need for a display panel to improve the above problems.

SUMMARY OF INVENTION

The present disclosure provides a display panel and a manufacturing method thereof to improve the technical problem of viewing angle deviation caused by the optical path difference of light in the existing display panel.

To achieve the above objective, the technical solution provided by the present disclosure is as follows:

The present disclosure provides a method for manufacturing a display panel, including:

S10, providing a substrate, forming a first organic layer on the substrate;

S20, forming a reflective layer on the first organic layer;

S30, forming a light transmissive layer on the reflective layer;

S40, forming a light emitting device layer on the light transmissive layer, wherein the reflective layer comprises a first surface adjacent to the first organic layer and a second surface adjacent to the light transmissive layer, the second surface being a concave surface.

In the method of manufacturing the display panel of the present disclosure, wherein the step S10 includes:

S101, providing a substrate;

S102, forming an organic layer on the substrate;

S103, forming a first groove on the organic film layer by using a predetermined device.

In the method of manufacturing the display panel of the present disclosure, wherein the predetermined device is a silicon wafer including regular spherical protrusions, and a surface of the first groove in contact with the reflective layer is a first curved surface.

In the method of manufacturing the display panel of the present disclosure, wherein the step 20 includes:

forming a reflective layer in the first groove by evaporation, and the first surface and the second surface of the reflective layer are paralleled to the first curved surface.

In the method of manufacturing the display panel of the present disclosure, wherein the predetermined device is a silicon wafer comprising regular rectangular protrusions, and a surface of the first groove in contact with the reflective layer is a plane.

In the method of manufacturing the display panel of the present disclosure, wherein the step S20 comprises:

forming a reflective film layer in the first groove by evaporation; and forming a second groove in the reflective film layer by an etching process, wherein the second groove comprises a second curved surface in contact with the light transmissive layer.

In the method of manufacturing the display panel of the present disclosure, wherein the step S30 comprises:

S301, hydrophobically modifying the reflective layer by plasma gas; and

S302, forming the light transmissive layer on the reflective layer, wherein the light transmissive layer comprises a first convex surface away from the reflective layer.

In the method of manufacturing the display panel of the present disclosure, wherein the step S40 comprises:

S401, forming an anode layer on the light transmissive layer;

S402, forming a light emitting layer on the anode layer; and

S403, forming a cathode layer on the light emitting layer, wherein surfaces of the anode layer, the light emitting layer, and the cathode layer are parallel to the first convex surface.

In the method of manufacturing the display panel of the present disclosure, wherein a maximum height of the first convex surface is smaller than a maximum depth of the first curved surface or a maximum depth the second curved surface.

In the method of manufacturing the display panel of the present disclosure, wherein the light transmissive layer comprises an inorganic oxide, an inorganic nitride, an organic polymer, or combinations thereof.

The present disclosure further provides a display panel, including:

a substrate;

a first organic layer disposed on the substrate;

a reflective layer disposed on the first organic layer;

a light transmissive layer disposed on the reflective layer; and a light emitting device layer disposed on the light transmissive layer; wherein the reflective layer comprises a first surface adjacent to the first organic layer and a second surface adjacent to the light transmissive layer, the second surface being a concave surface.

In the display panel of the present disclosure, wherein the first organic layer comprises a first groove, and the reflective layer is disposed in the first groove.

In the display panel of the present disclosure, wherein a surface of the first groove in contact with the reflective layer is a plane.

In the display panel of the present disclosure, wherein a surface of the first groove in contact with the reflective layer is a first curved surface.

In the display panel of the present disclosure, wherein the reflective layer comprises a second groove;

the light transmissive layer is disposed in the second groove; and the second groove comprises:

a first plane in contact with the first organic layer; and a second curved surface in contact with the light transmissive layer.

In the display panel of the present disclosure, wherein the light transmissive layer comprises a first convex surface away from the reflective layer.

In the display panel of the present disclosure, wherein the light emitting device layer comprises an anode layer disposed on the light transmissive layer, a light emitting layer disposed on the anode layer, and a cathode layer disposed on the light emitting layer; and the surfaces of the anode layer, the light emitting layer, and the cathode layer are parallel to the first convex surface.

In the display panel of the present disclosure, wherein a maximum height of the first convex surface is smaller than a maximum depth of the first curved surface or a maximum depth the second curved surface.

In the display panel of the present disclosure, wherein the light transmissive layer comprises one or composition of an inorganic oxide, an inorganic nitride, or an organic polymer.

In the display panel of the present disclosure, wherein the reflective layer is comprised of a semi-reflective or a total reflective material.

Beneficial effect: In the present disclosure, the surface of the reflective layer or the first organic layer away from the substrate is disposed as a concave curved surface, and the light emitting device layer is disposed as a convex surface. Therefore, in the present disclosure, a physical optical path difference of the light emitted by the light-emitting layer can be unchanged, and a viewing angle deviation of the display panel can be improved.

DESCRIPTION OF DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained from those skilled in the art based on these drawings without paying any creative effort.

DETAILED DESCRIPTION OF PREFERRED EMBODIMENTS

Figure 1:
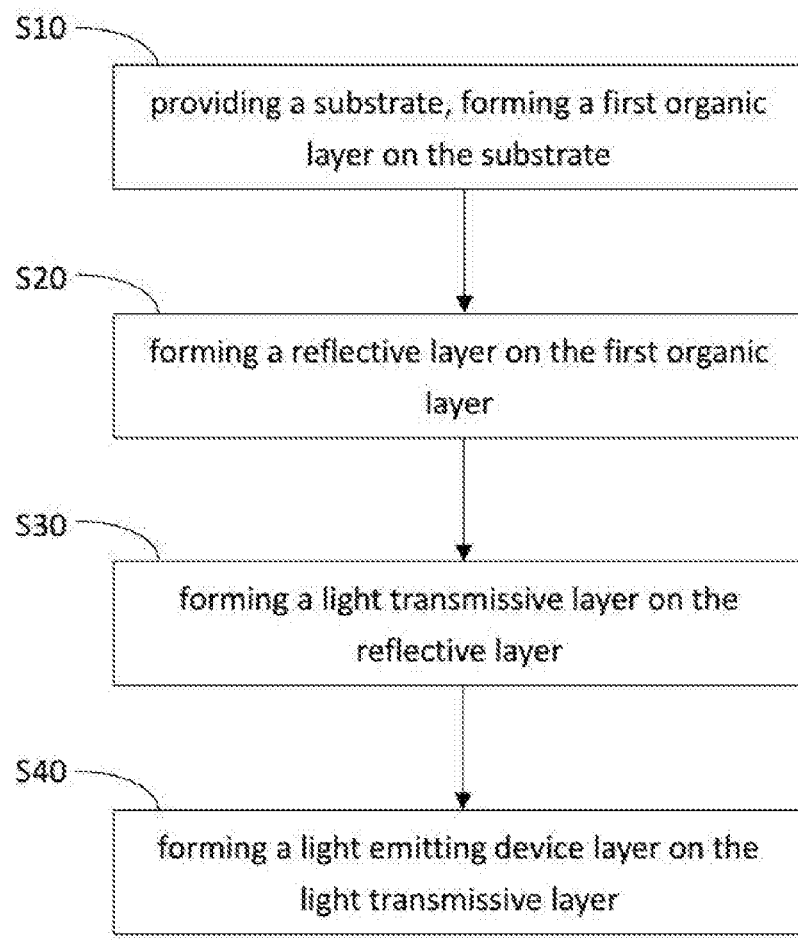
FIG. 1 shows a step diagram of a method of manufacturing a display panel of the present disclosure.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

Please refer to FIG. 1, FIG. 1 shows a step diagram of a method of manufacturing a display panel of the present disclosure.

Please refer to FIG. 2A to FIG. 2H, FIG. 2A to FIG. 2H shows a process step diagram of the display panel of the present disclosure.

A method of manufacturing a display panel 100 including the steps:

S10, providing a substrate 10, forming a first organic layer 20 on the substrate 10;

step 10 specifically includes:

S101, providing a substrate;

S102, forming an organic layer on the substrate;

S103, forming a first groove on the organic film layer by using a predetermined device.

The substrate 10 can be an array substrate.

The substrate 10 includes a substrate and a thin film transistor layer on the substrate.

Material of the substrate may be one of glass substrate, quartz substrate, resin substrate, and the like. When the substrate is a flexible substrate, material of the flexible substrate may be polyimide (PI).

The thin film transistor layer includes a plurality of thin film transistor units. The thin film transistor unit may be etching barrier layer type, back channel etching type or top gate thin film transistor type, and the like, which is not particularly limited in this embodiment.

In present disclosure, use a top gate thin film transistor type as an example for description.

For example, the thin film transistor unit may include a light shielding layer, a buffer layer, an active layer, a gate insulating layer, a gate electrode, an interlayer insulating layer, a source drain, a passivation layer, and a flat layer.

A first organic layer 20 is formed on the substrate 10.

Figure 2A:
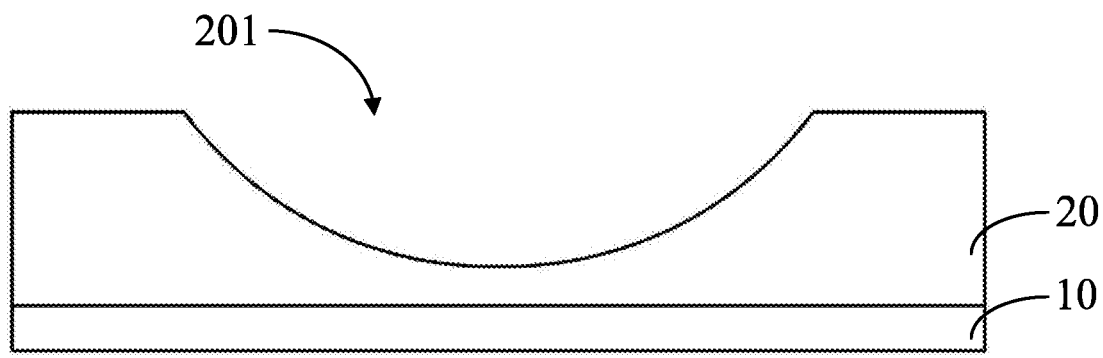
FIG. 2A to FIG. 2H shows a process step diagram of the display panel of the present disclosure.

Please refer to FIG. 2A, the first organic layer 20 includes a first groove 201.

Each pixel unit corresponds to one of the first grooves 201.

In this embodiment, the first organic layer 20 material may be poly (methyl methacrylate) (PMMA) organic film layer. The organic film layer can be formed by nanoimprinting, transfer printing, or the like.

The predetermined device is an embossed body, which may be a silicon wafer having protrusions.

In the process of the first organic layer 20, heating the PMMA organic film to vitrification, and after the transformation temperature, pressing together with the embossed body, and after the organic film layer is cooled, demolding to obtain a concave substrate 10.

Please refer to FIG. 2A, when the embossed body is a regular spherical protrusion, the surface of the first groove 201 is a curved surface.

Figure 2B:
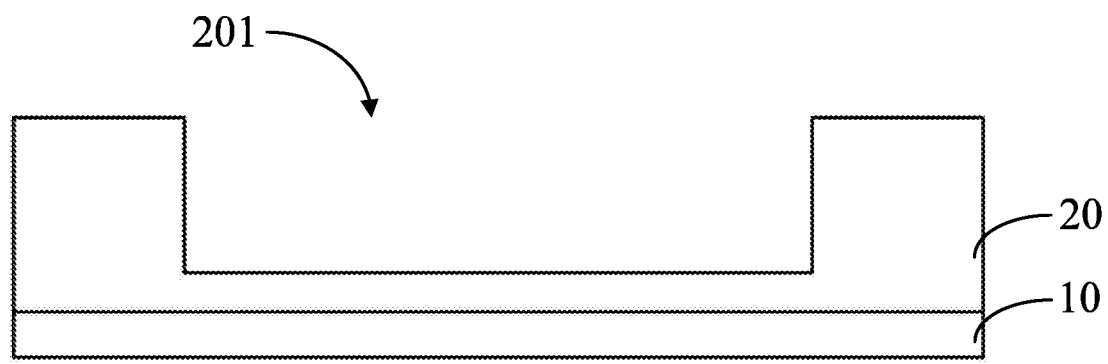

Please refer to FIG. 2B, when the embossed body is a regular cuboid protrusion, the surface of the first groove 201 is a plane.

S20, forming a reflective layer 30 on the first organic layer 20;

wherein the reflective layer 30 is formed in the first groove 201 of the first organic layer 20.

The reflective layer 30 includes a first surface adjacent to the first organic layer 20 and a second surface adjacent to the light transmissive layer 40, the second surface being a concave surface.

Figure 2C:
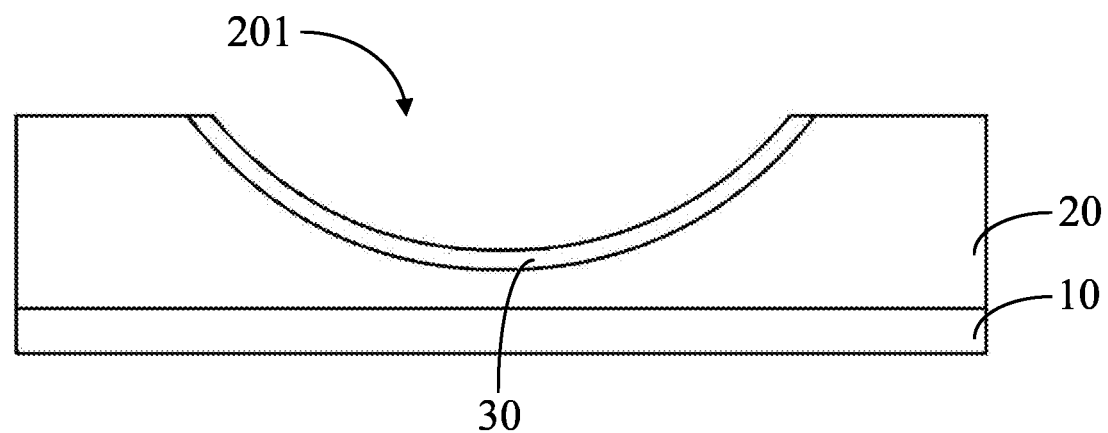

Please refer to FIG. 2C, on the basis of FIG. 2A, the reflective layer 30 is formed on the curved surface of the first groove 201. The surface of the first groove 201 in contact with the reflective layer 30 is a first curved surface. The first surface and the second surface on both sides of the reflective layer 30 are parallel to the first curved surface.

In this embodiment, the reflective layer 30 may be formed by evaporation.

Material of the reflective layer 30 may be composed of a total reflective material, for example, high reflectivity metals such as silver, magnesium or aluminum.

The reflective layer 30 may have a thickness between 100 nm to 150 nm.

Figure 2D:
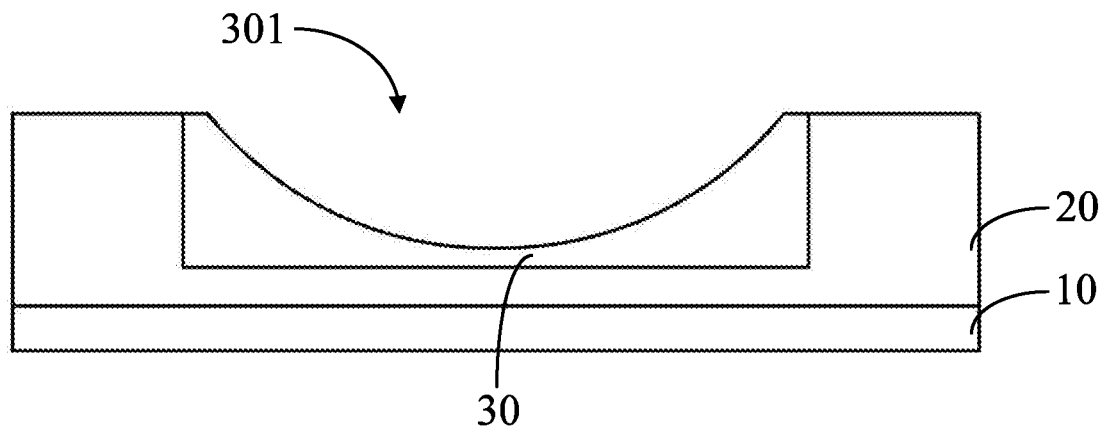

Please refer to FIG. 2D, based on the FIG. 2B, step S20 includes:

S201, forming a reflective film layer in the first groove by evaporation; and

S202, forming a second groove in the reflective film layer by an etching process.

The reflective layer 30 is formed on a curved surface of the first groove 201. A surface of the first groove 201 in contact with the reflective layer 30 is a plane.

In this embodiment, the surface of the first groove 201 in contact with the reflective layer 30 is a first plane. The surface of the second groove 301 is a second curved surface.

In this embodiment, the second curved surface may be parallel to the first curved surface.

In the embodiment, the reflective layer 30 may be formed by evaporation.

Material of the reflective layer 30 may be composed of a total reflective material, for example, high reflectivity metals such as silver, magnesium or aluminum.

The second curved surface may be formed by an etching process.

Figure 2E:
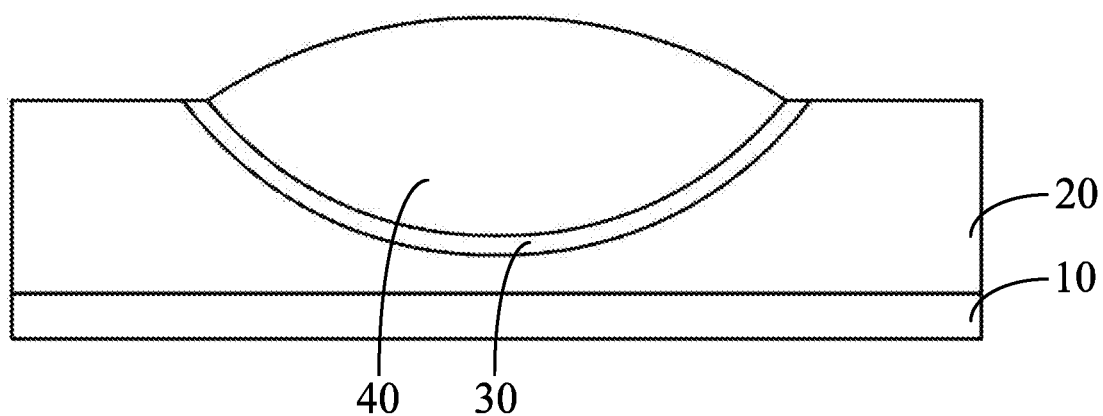
Figure 2F:
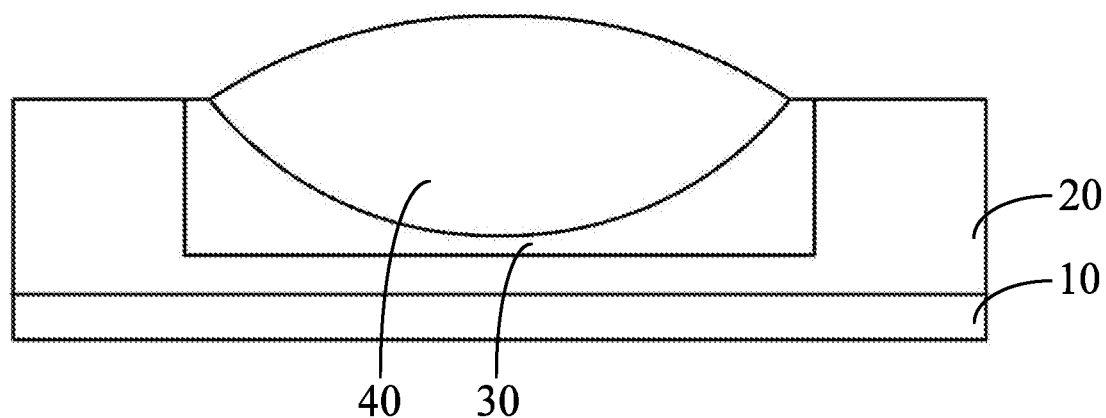

S30, forming a light transmissive layer 40 on the reflective layer 30;

Please refer to FIG. 2E or FIG. 2F, step S30 includes:

S301, hydrophobically modifying the reflective layer by plasma gas;

S302, forming the light transmissive layer on the reflective layer, wherein

The light transmissive layer 40 is formed in the groove formed in the reflective layer 30.

In this embodiment, the light transmissive layer 40 includes a first convex surface away from the reflective layer 30.

In this embodiment, the light transmissive layer 40 may be composed of high light transmittance material, and the light transmissive layer 40 may include an inorganic oxide, an inorganic nitride, an organic polymer, or combinations thereof.

For example, the inorganic oxide may be silicon oxide (SiOx).

The inorganic nitride may be silicon nitride (SiNx).

The organic polymer may be polymethyl methacrylate (PMMA), polypropylene (PP), Alec resin, silicone, epoxy resin, or combinations thereof.

In this embodiment, before forming the light transmissive layer 40, hydrophobically modified the reflective layer 30 is also necessary. A surface of the reflective layer 30 is typically hydrophobically modifying by plasma gas such as CF4. And material of the reflective layer 30 is dropped onto the second surface of the reflective layer 30 by inkjet printing, and finally formed into a film after UV curing or heat curing.

Figure 2G:
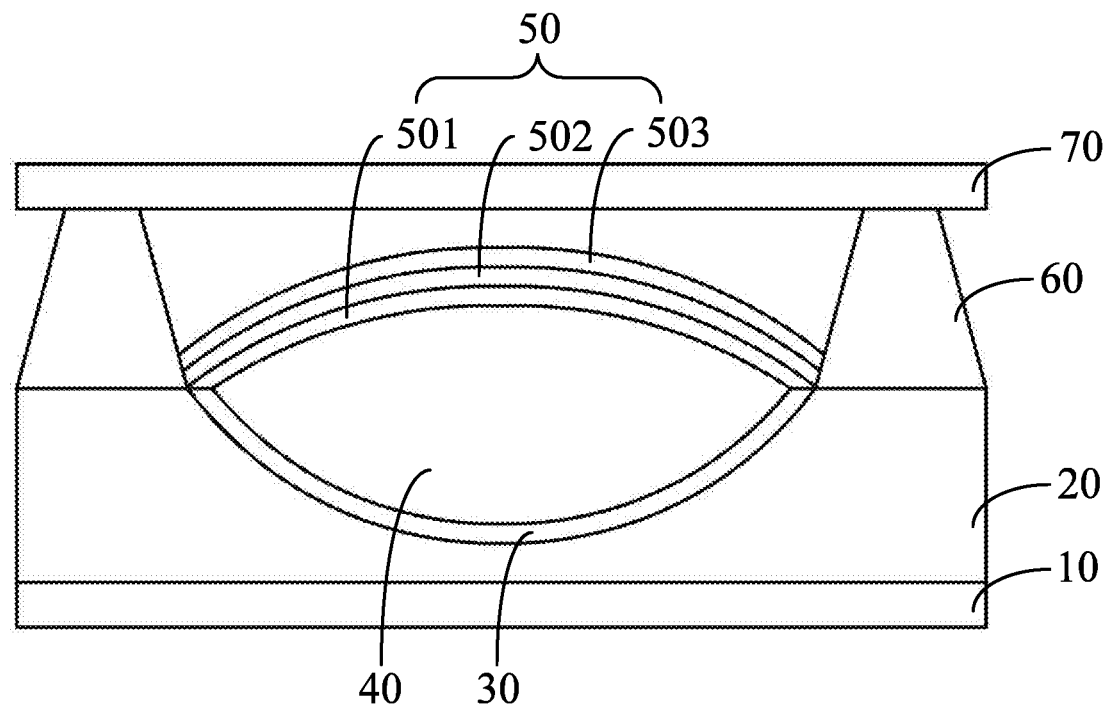
Figure 2H:
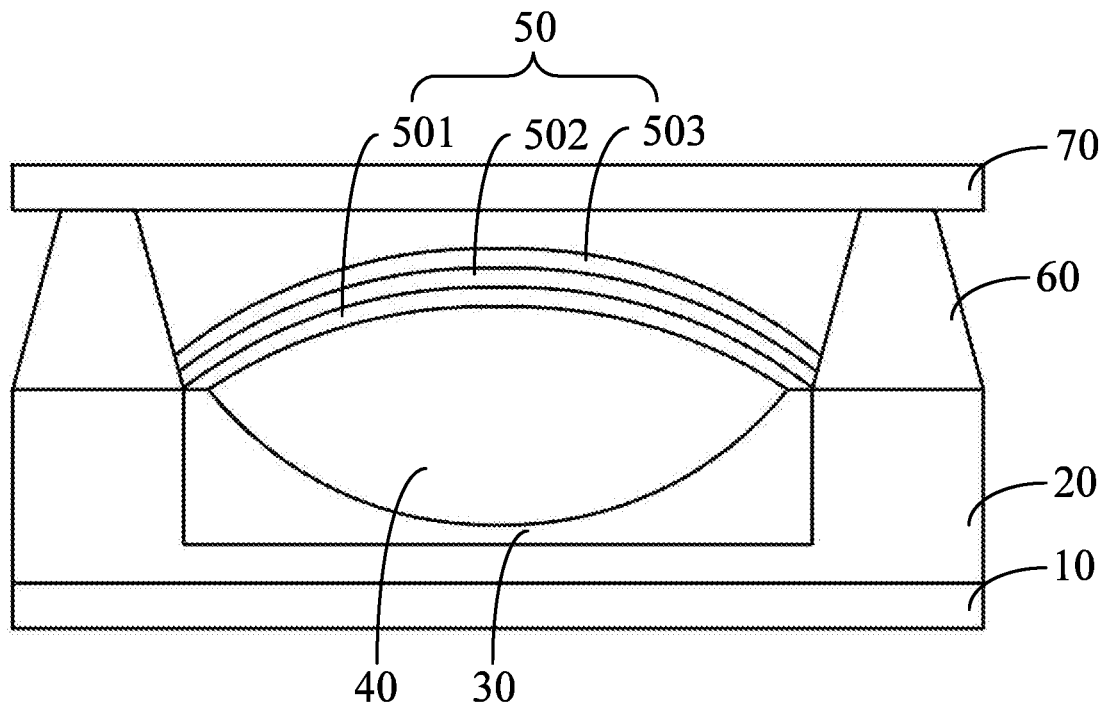

S40, forming a light emitting device layer 50 on the light transmissive layer 40;

Please refer to FIG. 2G or FIG. 2H, the step 40 includes:

S401, forming an anode layer on the light transmissive layer;

S402, forming a light emitting layer on the anode layer; and

S403, forming a cathode layer on the light emitting layer

The anode layer 501 is formed into a plurality of anodes by a patterning process.

The anode layer 501 is mainly used to provide holes for absorbing electrons.

The light emitting layer 502 is divided into a plurality of light emitting units by a pixel defining layer 60.

The light emitting layer 502 includes an organic light emitting material, which belongs to an organic semiconductor. It has a special energy band structure, which can emit a certain wavelength of photons after absorbing the electrons migrated from the anode, and these photons enter our eyes as the color we see.

The cathode layer 503 covers the light emitting layer 502. The cathode layer 503 is used to provide electrons that are absorbed by the holes.

In this embodiment, the surfaces of the anode layer 501, the light emitting layer 502, and the cathode layer 503 are parallel to the first convex surface.

The first convex surface and the second convex surface are designed as a paraboloid according to the principle of the flashlight reflector, such that the light emitted from the light emitting layer 502 passes through the paraboloid and is parallel to the axis of symmetry of the paraboloid, thereby reducing the optical path difference of the light emitted by the light emitting layer 502. If the paraboloid is a hemispherical surface, the optical path difference of the light emitted by the light emitting layer 502 is equal.

In the present disclosure, by disposing a surface of the reflective layer 30 or a first organic layer 20 away from the substrate 10 to a concave curved surface, so that the optical path difference of the light emitted by the light emitting layer 502 is constant, therefore improves the viewing angle deviation of the display panel 100.

Since the light is emitted back and forth in the light emitting device layer 50, by disposing the light emitting device layer 50 as a convex surface, which also functions to collect light, further reducing the physical optical path difference of the light emitted by the light emitting layer 502.

In an embodiment, a maximum height of the first convex surface is smaller than a maximum depth of the first curved surface or a maximum depth the second curved surface.

In this embodiment, when the display panel 100 is a top-emitting OLED device, the anode layer 501 may be a transparent electrode.

When the anode layer 501 is a transparent electrode, the cathode layer 503 is a translucent electrode. The total reflection of the reflective layer 30 and the semi-reflection of the cathode layer 503 causes a microcavity effect.

When the display panel 100 is a bottom emitting OLED device, the anode layer 501 may be a transparent electrode, the cathode layer 503 is a non-transparent electrode, and the reflective layer 30 is a semi-reflective layer 30 composed of semi-reflective material. The semi-reflection of the reflective layer 30 and the total reflection of the cathode layer 503 causes a microcavity effect.

In this embodiment, the transparent anode layer 501 may be at least one of indium tin oxide (ITO), indium zinc oxide (IZO), zinc oxide (ZnO), indium oxide (In2O3), indium gallium oxide (IGO), or zinc aluminum oxide (AZO).

Please refer to FIG. 2E or FIG. 2F, the display panel 100 further includes an encapsulation layer 70 disposed on the light emitting device layer 50.

The encapsulation layer 70 may be a thin film encapsulation layer, which is mainly used for blocking water and oxygen, and preventing external water vapor from eroding the organic light emitting layer 502. The encapsulation layer 70 may be formed by laminating at least one organic layer and at least one inorganic layer. The organic layer is usually located in the middle of the encapsulation layer 70, and the inorganic layer is located on both sides of the encapsulation layer 70, wrapping the organic layer in the middle.

In the present disclosure, by disposing the surface of the reflective layer or the first organic layer away from the substrate as a concave curved surface, and disposing the light emitting device layer as a convex surface, so that the physical optical path difference of the light emitted by the light emitting layer is unchanged, and the viewing angle deviation of the display panel is improved.

Figure 3:
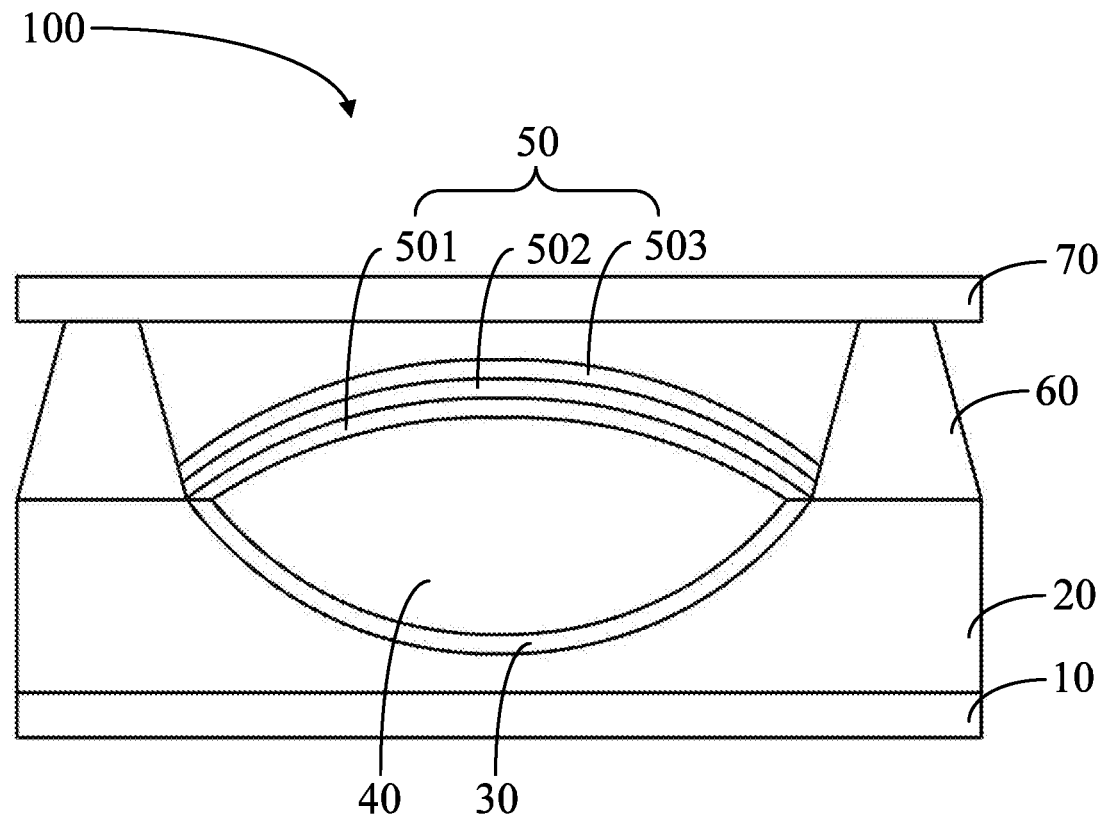
FIG. 3 shows a first structural diagram of the display panel of the present disclosure

Please refer to FIG. 3, FIG. 3 shows a first structural diagram of the display panel of the present disclosure.

The display panel 100 includes a substrate 10, a first organic layer 20 disposed on the substrate 10, a reflective layer 30 disposed on the first organic layer 20, a light transmissive layer 40 disposed on the reflective layer 30, a light emitting device layer 50 disposed on the light transmissive layer 40 and an encapsulation layer 70 disposed on the light emitting device layer 50.

The substrate 10 includes a substrate and a thin film transistor layer on the substrate.

Material of the substrate may be one of glass substrate, quartz substrate, resin substrate, and the like. When the substrate is a flexible substrate, material of the flexible substrate may be polyimide (PI).

The thin film transistor layer includes a plurality of thin film transistor units. The thin film transistor unit may be etching barrier layer type, back channel etching type or top gate thin film transistor type, and the like, which is not particularly limited in this embodiment.

In present disclosure, use a top gate thin film transistor type as an example for description.

For example, the thin film transistor unit may include a light shielding layer, a buffer layer, an active layer, a gate insulating layer, a gate electrode, an interlayer insulating layer, a source drain, a passivation layer, and a flat layer.

The first organic layer 20 includes the first groove 201.

Each pixel unit corresponds to one of the first grooves 201.

In this embodiment, the first organic layer 20 material may be poly (methyl methacrylate) (PMMA) organic film layer. The organic film layer can be formed by nanoimprinting, transfer printing, or the like.

In the process of the first organic layer 20, the predetermined device is an embossed body, which may be a silicon wafer having protrusions, heating the PMMA organic film to vitrification, and after the transformation temperature, pressing together with the embossed body, and after the organic film layer is cooled, demolding to obtain a concave substrate 10.

Please refer to FIG. 3, when the embossed body is a regular spherical protrusion, the surface of the first groove 201 is a curved surface.

Figure 4:
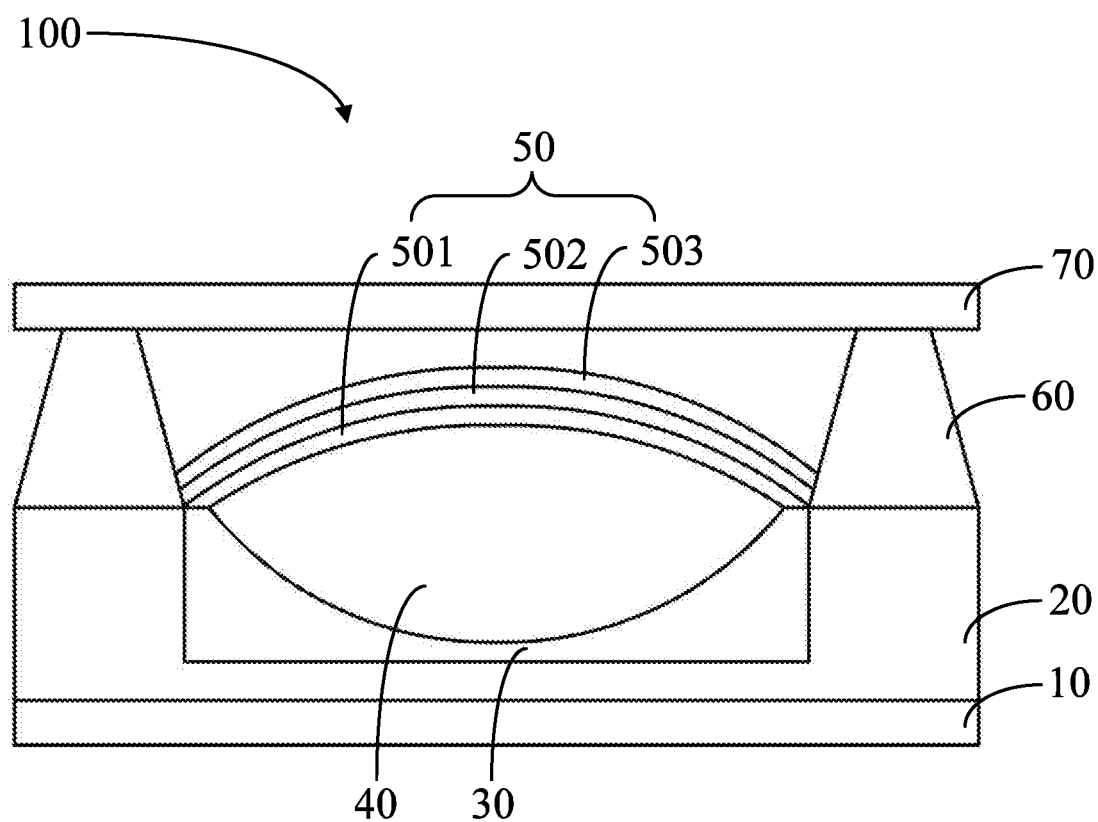
FIG. 4 shows a second structural diagram of the display panel of the present disclosure.

Please refer to FIG. 4, FIG. 4 shows a second structural diagram of the display panel of the present disclosure.

When the embossed body is a regular cuboid protrusion, the surface of the first groove 201 is a plane.

The reflective layer 30 is formed in the first groove 201 of the first organic layer 20.

The reflective layer 30 includes a first surface adjacent to the first organic layer 20 and a second surface adjacent to the light transmissive layer 40, the second surface being a concave surface.

Please refer to FIG. 3, the reflective layer 30 is formed on the curved surface of the first groove 201. The surface of the first groove 201 in contact with the reflective layer 30 is a first curved surface. The first surface and the second surface on both sides of the reflective layer 30 are parallel to the first curved surface.

In this embodiment, the reflective layer 30 may be formed by evaporation.

Material of the reflective layer 30 may be composed of a total reflective material, for example, high reflectivity metals such as silver, magnesium or aluminum.

The reflective layer 30 may have a thickness between 100 nm to 150 nm.

Please refer to FIG. 4, the reflective layer 30 is formed on a curved surface of the first groove 201. A surface of the first groove 201 in contact with the reflective layer 30 is a plane.

The reflective layer 30 includes the second groove 301.

In this embodiment, the surface of the first groove 201 in contact with the reflective layer 30 is a first plane. The surface of the second groove 301 is a second curved surface.

In this embodiment, the second curved surface may be parallel to the first curved surface.

In the embodiment, the reflective layer 30 may be formed by evaporation.

Material of the reflective layer 30 may be composed of a total reflective material, for example, high reflectivity metals such as silver, magnesium or aluminum.

The second curved surface may be formed by an etching process.

Please refer to FIG. 3 or FIG. 4, the light transmissive layer 40 includes a first convex surface away from the reflective layer 30.

In this embodiment, the light transmissive layer 40 may be composed of high light transmittance material, and the light transmissive layer 40 may include an inorganic oxide, an inorganic nitride, an organic polymer, or combinations thereof For example, the inorganic oxide may be silicon oxide (SiOx).

The inorganic nitride may be silicon nitride (SiNx).

The organic polymer may be polymethyl methacrylate (PMMA), polypropylene (PP), Alec resin, silicone, epoxy resin, or combinations thereof.

In this embodiment, before forming the light transmissive layer 40, hydrophobically modifying the reflective layer 30 is also necessary. A surface of the reflective layer 30 is typically hydrophobically modified by plasma gas such as CF4. And material of the reflective layer 30 is dropped onto the second surface of the reflective layer 30 by inkjet printing, and finally formed into a film after UV curing or heat curing.

Please refer to FIG. 3 or FIG. 4, the light emitting device layer 50 includes an anode layer 501 disposed on the light transmissive layer 40, a light emitting layer 502 disposed on the anode layer 501, and a cathode layer 503 disposed on the light emitting layer 502.

The anode layer 501 is formed into a plurality of anodes by a patterning process.

The anode layer 501 is mainly used to provide holes for absorbing electrons.

The light emitting layer 502 is divided into a plurality of light emitting units by a pixel defining layer 60.

The light emitting layer 502 includes an organic light emitting material, which belongs to an organic semiconductor. It has a special energy band structure, which can emit a certain wavelength of photons after absorbing the electrons migrated from the anode, and these photons enter our eyes as the color we see.

The cathode layer 503 covers the light emitting layer 502. The cathode layer 503 is used to provide electrons that are absorbed by the holes.

In this embodiment, the surfaces of the anode layer 501, the light emitting layer 502, and the cathode layer 503 are parallel to the first convex surface.

The first convex surface and the second convex surface are designed as a paraboloid according to the principle of the flashlight reflector, such that the light emitted from the light emitting layer 502 passes through the paraboloid and is parallel to the axis of symmetry of the paraboloid, thereby reducing the optical path difference of the light emitted by the light emitting layer 502. If the paraboloid is a hemispherical surface, the optical path difference of the light emitted by the light emitting layer 502 is equal.

In the present disclosure, by disposing a surface of the reflective layer 30 or a first organic layer 20 away from the substrate 10 to a concave curved surface, so that the optical path difference of the light emitted by the light emitting layer 502 is constant, therefore improves the viewing angle deviation of the display panel 100.

Since the light is emitted back and forth in the light emitting device layer 50, by disposing the light emitting device layer 50 as a convex surface, which also functions to collect light, further reducing the physical optical path difference of the light emitted by the light emitting layer 502.

In an embodiment, a maximum height of the first convex surface is smaller than a maximum depth of the first curved surface or a maximum depth the second curved surface.

In this embodiment, when the display panel 100 is a top-emitting OLED device, the anode layer 501 may be a transparent electrode.

When the anode layer 501 is a transparent electrode, the cathode layer 503 is a translucent electrode. The total reflection of the reflective layer 30 and the semi-reflection of the cathode layer 503 causes a microcavity effect.

When the display panel 100 is a bottom emitting OLED device, the anode layer 501 may be a transparent electrode, the cathode layer 503 is a non-transparent electrode, and the reflective layer 30 is a semi-reflective layer 30 composed of semi-reflective material. The semi-reflection of the reflective layer 30 and the total reflection of the cathode layer 503 causes a microcavity effect.

In this embodiment, the transparent anode layer 501 may be at least one of indium tin oxide (ITO), indium zinc oxide (IZO), zinc oxide (ZnO), indium oxide (In2O3), indium gallium oxide (IGO), or zinc aluminum oxide (AZO)

Please refer to FIG. 3 or FIG. 4, the encapsulation layer 70 may be a thin film encapsulation layer, which is mainly used for blocking water and oxygen, and preventing external water vapor from eroding the organic light emitting layer 502. The encapsulation layer 70 may be formed by laminating at least one organic layer and at least one inorganic layer. The organic layer is usually located in the middle of the encapsulation layer 70, and the inorganic layer is located on both sides of the encapsulation layer 70, wrapping the organic layer in the middle.

The present disclosure provides a display panel and manufacturing method thereof, the display panel including a substrate, a first organic layer disposed on the substrate, a reflective layer disposed on the first organic layer, a light transmissive layer disposed on the reflective layer, and the reflective layer includes a first surface adjacent to the first organic layer and a second surface adjacent to the light transmissive layer, the second surface being a concave surface. In the present disclosure, the surface of the reflective layer or the first organic layer away from the substrate is disposed as a concave curved surface, and the light emitting device layer is disposed as a convex surface. Therefore, in the present disclosure, a physical optical path difference of the light emitted by the light-emitting layer can be unchanged, and a viewing angle deviation of the display panel can be improved.

In the above, although the present disclosure has been disclosed in the above preferred embodiments, the preferred embodiments are not intended to limit the present disclosure, and those skilled in the art can make various modifications without departing from the spirit and scope of the present disclosure. Therefore, the scope of protection of the present disclosure is defined by the claims.

What is claimed is:

1. A method of manufacturing a display panel, comprising the steps of:
   S101, providing a substrate;
   S102, forming an organic film layer on the substrate;
   S103, forming a first groove on the organic film layer by using an embossed body to form a first organic layer;
   S20, forming a reflective layer on the first organic layer;
   S30, forming a light transmissive layer on the reflective layer; and
   S40, forming a light emitting device layer on the light transmissive layer, wherein the reflective layer comprises a first surface adjacent to the first organic layer and a second surface adjacent to the light transmissive layer, the second surface having a concave surface; and
   wherein the embossed body is a silicon wafer comprising regular rectangular protrusions, and a surface of the first groove in contact with the reflective layer is a plane.

2. The method of manufacturing the display panel as claimed in claim 1, wherein the step S20 comprises:
   forming a reflective film layer in the first groove by evaporation; and
   forming a second groove in the reflective film layer by an etching process, wherein the concave surface of the second surface comprises the second groove; wherein the second groove comprises a curved surface in contact with the light transmissive layer.

3. The method of manufacturing the display panel as claimed in claim 2, wherein the light transmissive layer comprises a first convex surface away from the reflective layer; wherein a maximum height of the first convex surface is smaller than a maximum depth of the curved surface.

4. The method of manufacturing the display panel as claimed in claim 1, wherein the step S30 comprises:
   S301, hydrophobically modifying the reflective layer by plasma gas; and
   S302, forming the light transmissive layer on the reflective layer, wherein
   the light transmissive layer comprises a first convex surface away from the reflective layer.

5. The method of manufacturing the display panel as claimed in claim 1, wherein the light transmissive layer comprises a first convex surface away from the reflective layer; wherein the step S40 comprises:
- S401, forming an anode layer on the light transmissive layer;
- S402, forming a light emitting layer on the anode layer; and
- S403, forming a cathode layer on the light emitting layer, wherein
- surfaces of the anode layer, the light emitting layer, and the cathode layer are parallel to the first convex surface.

6. The method of manufacturing the display panel as claimed in claim 1, wherein the light transmissive layer comprises an inorganic oxide, an inorganic nitride, an organic polymer, or combinations thereof.

7. A display panel, comprising:
- a substrate;
- a first organic layer disposed on the substrate;
- a reflective layer disposed on the first organic layer;
- a light transmissive layer disposed on the reflective layer; and
- a light emitting device layer disposed on the light transmissive layer; wherein the reflective layer comprises a first surface adjacent to the first organic layer and a second surface adjacent to the light transmissive layer, the second surface being a concave surface;
- wherein the first organic layer comprises a first groove, and the reflective layer is disposed in the first groove, and wherein a surface of the first groove in contact with the reflective layer is a plane.

8. The display panel as claimed in claim 7, wherein
- the concave surface of the second surface of the reflective layer comprises a second groove;
- the light transmissive layer is disposed in the second groove; and
- the second groove comprises a curved surface in contact with the light transmissive layer.

9. The display panel as claimed in claim 8, wherein
the light transmissive layer comprises a first convex surface away from the reflective layer.

10. The display panel as claimed in claim 9, wherein
- the light emitting device layer comprises an anode layer disposed on the light transmissive layer, a light emitting layer disposed on the anode layer, and a cathode layer disposed on the light emitting layer; and
- the surfaces of the anode layer, the light emitting layer, and the cathode layer are parallel to the first convex surface.

11. The display panel as claimed in claim 9, wherein
a maximum height of the first convex surface is smaller than a maximum depth of the curved surface.

12. The display panel as claimed in claim 7, wherein
the light transmissive layer comprises one or a composition of an inorganic oxide, an inorganic nitride, or an organic polymer.

13. The display panel as claimed in claim 7, wherein
the reflective layer is comprised of a semi-reflective or a total reflective material.

* * * * *